United States Patent [19]

Lien

[11] Patent Number: 5,786,245

[45] Date of Patent: Jul. 28, 1998

[54] METHOD FOR FORMING A STABLE SRAM CELL USING LOW BACKGATE BIASED THRESHOLD VOLTAGE SELECT TRANSISTORS

[75] Inventor: Chuen-Der Lien, Mountain View, Calif.

[73] Assignee: Integrated Device Technology, Inc., Santa Clara, Calif.

[21] Appl. No.: 607,414

[22] Filed: Feb. 28, 1996

Related U.S. Application Data

[62] Division of Ser. No. 373,863, Aug. 2, 1994, Pat. No. 5,675,165.

[51] Int. Cl.$^6$ .................................................. H01L 21/336
[52] U.S. Cl. ........................ 438/197; 438/142; 438/200; 438/217
[58] Field of Search ..................... 437/34, 44, 45, 437/57, 59, 48; 438/197, 217, 142, 200

[56] References Cited

U.S. PATENT DOCUMENTS

| 3,868,274 | 2/1975 | Hubar et al. ................. 437/45 |
| 4,052,229 | 10/1977 | Pashley ........................ 437/45 |
| 4,591,890 | 5/1986 | Lund et al. ................... 257/398 |
| 4,682,408 | 7/1987 | Takebayashi ................. 257/399 |
| 4,697,332 | 10/1987 | Joy et al. ..................... 257/371 |
| 5,360,749 | 11/1994 | Anjum et al. ................. 437/44 |
| 5,373,863 | 12/1994 | Jeon .............................. 257/371 |
| 5,416,038 | 5/1995 | Hsue ............................. 437/57 |
| 5,484,742 | 1/1996 | Urai .............................. 437/44 |

FOREIGN PATENT DOCUMENTS

| 239250A2 | 9/1987 | European Pat. Off. . |
| 600437A2 | 6/1994 | European Pat. Off. . |
| 55-77177 | 6/1980 | Japan ........................ 257/401 |
| 4130774 | 5/1992 | Japan ........................ 257/401 |

*Primary Examiner*—Tuan H. Nguyen
*Attorney, Agent, or Firm*—Skjerven, Morrill, MacPherson, Franklin & Friel

[57] ABSTRACT

A more stable SRAM cell is provided by reducing the backgate biased threshold voltage of the SRAM's select transistor. In some embodiments, masking layers are used during dopant implantation of the select transistors to minimize the net dopant concentration in the select transistor's channel region. Minimizing this net dopant concentration lowers the backgate biased threshold voltage of the select transistor without any reduction in its on-resistance. Another embodiment may be used to achieve increased stability for SRAM cells formed with CMOS technology. The masking layers used to form N- and P-type well regions are overlapped such that a third well formed intermediate the N- and P-type wells has a dopant concentration equal to the net concentrations of the respective N- and P-type wells. This third well, therefore, may be used as discussed above to achieve a lower backgate biased threshold voltage. Yet another embodiment is provided in which a lower backgate biased threshold voltage is achieved by reducing a portion of the length of the channel region while the lengths of other portions of the channel are unaltered.

3 Claims, 6 Drawing Sheets

METHOD FOR FORMING A STABLE SRAM CELL USING LOW BACKGATE BIASED THRESHOLD VOLTAGE SELECT TRANSISTORS

This application is a division of application Ser. No. 08/373,863, filed Aug. 2, 1994, now U.S. Pat. No. 5,675,165.

FIELD OF THE INVENTION

The present invention relates to static random access memory (SRAM) devices. More particularly, the present invention relates to an SRAM cell having increased stability.

BACKGROUND OF THE INVENTION

Advancing technology in the field of semiconductor processing has allowed for the scaling down of integrated circuit (IC) memory cells, thus enabling greater memory storage capabilities in a decreasing amount of area. However, as the dimensions of IC memory cells decrease, the required stability of these memory cells becomes increasingly harder to achieve.

It is necessary to bias the select transistors used in SRAM cells in order to prevent the select transistors from becoming reverse biased when reading and writing data to the cell. Biasing the substrate of an MOS transistor, however, increases the normal threshold voltage of the MOS transistor. This higher threshold voltage, often referred to as the backgate biased threshold voltage, may lead to stability problems in the memory cell as described below.

The width of a select transistor's channel region is of great importance to the stability of its associated SRAM cell. Select transistors desirably have a relatively high on-resistance and are thus usually formed having a narrow channel region. A decrease in the width of a transistor's channel region, however, results in an increase in the transistor's backgate biased threshold voltage. Thus, the desire for a lower backgate biased threshold voltage is typically compromised in lieu of a desirable high on-resistance.

A typical prior art SRAM cell is shown in FIG. 1. Cell 1 has two storage transistors Q1,Q2, two pull-up load resistors 2,4, and two select transistors Q3,Q4. Cross-coupled storage transistors Q1,Q2 and load resistors 2,4 form a flip-flop which stores data in the form of voltage levels with the two side of the flip-flop having opposite voltage configurations. The flip-flop has two stable states which may be denoted as logic "1" and logic "0". Cell 1 is assumed to be in a logic "1" state when node 6 is high and node 8 is low. In this state, transistor Q1 is off and transistor Q2 is on. Accordingly, in a logic "0" state, node 6 is low and node 8 is high with transistor Q1 on and transistor Q2 off.

Generally, word line 10 enables cell 1 to communicate with bit lines 12,14. To select cell 1 for reading to and/or writing from bit lines 12,14, the voltage of word line 10 ($V_{wl}$) is held high. A high $V_{wl}$ turns on select transistors Q3,Q4 which, in turn, allow bit lines 12,14 access to storage transistors Q1,Q2 of cell 1. Accordingly, to isolate cell 1 from bit lines 12,14, the word line is held low (i.e., $V_{wl}$ equals ground potential), thereby turning off select transistors Q3,Q4.

For the following discussion of the operation of cell 1, it is assumed that cell 1 is in the logic "1" state. Recalling that in the logic "1" state node 6 is high and node 8 is low, the precise voltage levels of nodes 6 and 8 will depend upon whether or not cell 1 has been selected. For instance, when cell 1 is not selected, $V_{wl}$ equals zero, the voltage at node 6 ($V_H$) is slightly lower than $V_{cc}$, and the voltage at node 8 ($V_L$) equals approximately zero.

When cell 1 is selected, however, $V_{wl}$ goes high to $V_{cc}$. $V_H$ is then given by $$V_{WL} - V_{tb(Q3)},\qquad\text{Eqn. 1}$$

where $V_{tb(Q3)}$ is the backgate biased threshold voltage of select transistor Q3 (note that transistor Q1 is off). Since transistors Q2 and Q4 act as a voltage divider, the value of $V_L$ depends upon the ratio of the resistances of transistors Q4 and Q2. This ratio is hereinafter referred to as the cell ratio. Normally, the cell ratio is greater than 3 and $V_L$ is about 0.5 volts.

If the voltage difference between $V_H$ and $V_L$ becomes too small, bit lines 12,14 will be unable to determine whether cell 1 is in the "0" or "1" state and, thus, data stored in cell 1 may be lost. Accordingly, to ensure the stability of cell 1, the voltage differential between $V_H$ and $V_L$ should be as large as possible. In other words, the stability of cell 1 may be improved either by decreasing $V_L$ or by increasing $V_H$, thereby increasing the voltage differential between $V_H$ and $V_L$.

The normal value of $V_L$ may be lowered by simply increasing the cell ratio by either (1) increasing the on-resistance of select transistor Q4 or (2) decreasing the on-resistance of storage transistor Q2. This approach, although increasing cell stability, degrades the performance of cell 1. First, increasing the on-resistance of transistor Q4 would reduce current flow through cell 1 and thus reduce the speed of cell 1. Second, decreasing the on-resistance of transistor Q2 would require additional surface area, therefore increasing the size of cell 1.

As mentioned above, a heightened stability of cell 1 can also be achieved by increasing $V_H$. From equation 1 it can be seen that $V_H$ may be increased either by (1) increasing $V_{wl}$ or (2) decreasing $V_{tb(Q3)}$. Increasing $V_{wl}$, however, may be problematic. First, an increased $V_{wl}$ requires additional circuit techniques such as charge pumping and thus increases circuit complexity. Second, a higher $V_{wl}$ results in a higher voltage provided on the gate oxide of select transistors Q3,Q4 which, in turn, may require an increased gate oxide thickness with the accompanying degradation in performance of the select transistors. Therefore, the most practical way to increase $V_H$, and thereby increase the stability of cell 1, is to reduce the $V_{tb}$ of select transistors Q3 and Q4 (note that when cell 1 is in the logic "0" state, node 8 will be denoted as $V_H$ and node 6 will be denoted as $V_L$).

SUMMARY OF THE INVENTION

In response to the problems in the prior art discussed above, an SRAM cell is provided in which the cell's select transistors exhibit a lower backgate biased threshold voltage without any corresponding decrease in on-resistance which, as discussed above, increases the stability of cell.

A typical SRAM cell has field regions formed in the substrate adjacent each of its select transistors to help electrically insulate the select transistors from adjacent transistors. During dopant implantation of these field regions, the implanted dopants will diffuse laterally into the select transistor's channel region, thereby increasing the net dopant concentration in the channel region. This increased dopant concentration in the select transistor's channel region, in turn, increases the backgate biased threshold voltage of the select transistor.

In one embodiment of the present invention, masking layers used to form field regions are positioned such that the field regions are located a sufficient distance away from the select transistor's channel region to ensure that any lateral diffusion of dopants implanted into the field regions will not extend into the channel region. Since the dopants will not be able to diffuse into the channel region, the net dopant concentration of the channel region will not increase. Accordingly, an SRAM cell formed in accordance with the present embodiment will exhibit a lower backgate biased threshold voltage than those prior art SRAM cells described above.

In another embodiment, the select transistor's channel region is counter-doped in order to lower the net dopant concentration in the channel region. During fabrication of a select transistor having a channel region of a first conductivity type, an additional masking layer is used to implant dopants of a second conductivity type into the channel region, thereby reducing the net dopant concentration in the channel region. It follows, then, that a select transistor having a lower channel region dopant concentration will exhibit a lower backgate biased threshold voltage which, as discussed above, results in more stable SRAM cell.

Yet another embodiment may also be used to achieve increased stability for SRAM cells formed with CMOS technology. The masking layers used to form N- and P-type well regions are overlapped such that a third well region is formed intermediate the N- and P-type wells This third well will have a resultant dopant concentration equal to the net dopant concentrations of the respective N- and P-type wells, i.e., the net dopant concentration of the third well region will be less than either of the N- and P-type well region dopant concentrations. This third well, therefore, may be used as discussed above to achieve a lower backgate biased threshold voltage and thus a more stable SRAM cell.

The backgate biased threshold voltage of a select transistor may also be lowered by reducing the length of the channel region. A shorter channel region, however, decreases the select transistor's on-resistance which, in turn, undesirably increases the value of $V_L$. Thus, in yet another embodiment, an SRAM cell is provided which has a partially shortened channel region. The select transistor's gate electrode is etched in such a manner so as to leave notches in one or more sides of the gate, thereby forming a channel region having first and second portions wherein the length of the first portion is shorter than the length of the second portion. The length of the first portion of the channel region is shortened so as to effectively reduce the backgate biased threshold voltage of the select transistor. The second portion is sufficiently long so as to ensure that the select transistor's on-resistance is not significantly decreased as a result of the first, shorter portion. Thus, this embodiment achieves an increased $V_H$ without an undesirably large increase in $V_L$, thereby resulting in a more stable SRAM cell.

DETAILED DESCRIPTION OF THE PREFERRED EMBODIMENTS

In accordance with the present invention, a memory cell is provided in which the select transistors exhibit a low backgate biased threshold voltage ($V_{tb}$), while maintaining a high on-resistance. Thus, by maximizing $V_H$ (by reducing $V_{tb}$) and minimizing $V_L$ (by maximizing on-resistance), an increased cell stability is achieved.

Figure 2A:
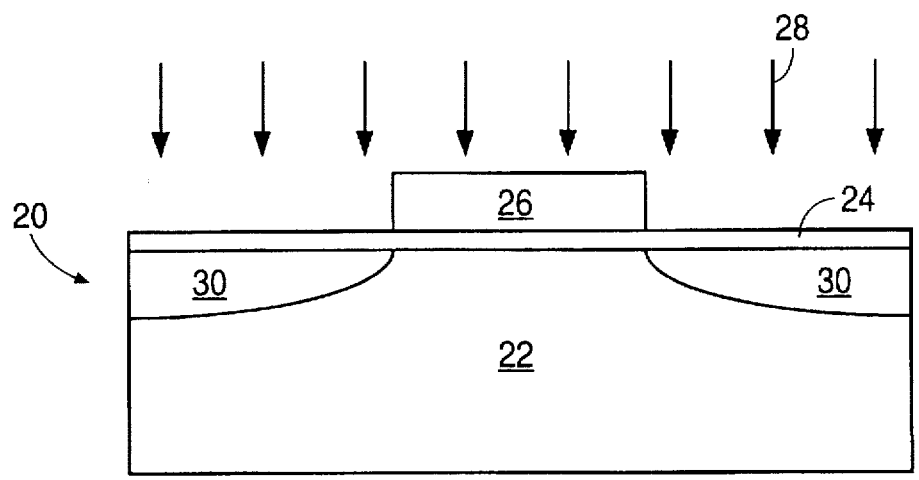
FIG. 2A is cross-sectional view of a select transistor illustrating a prior art masking step.

FIG. 2A shows a prior art masking step used in the fabrication of prior art select transistor 20 formed in a P-type substrate 22. A layer of oxide 24 is formed on the surface of substrate 22. P-type dopants 28 are implanted into transistor 20 to form, using nitride masking layer 26, P-type field regions 30.

Figure 2B:
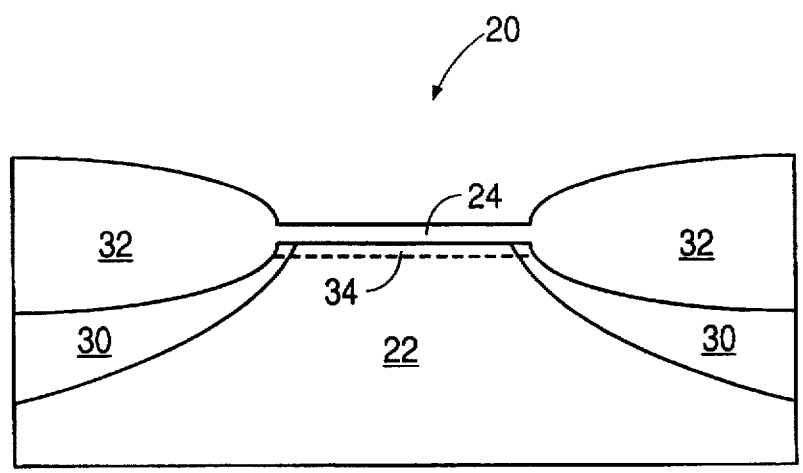
FIG. 2B is a cross-sectional view of the select transistor of FIG. 2A after dopant implantation.

FIG. 2B is a cross-sectional view of transistor 20 after dopant implantation has been completed. A LOCOS process is used to form field oxide regions 32, which drive field region 30 further into substrate 22. Field oxide regions 32, along with field regions 30, help to electrically insulate cell 20 from adjacent transistors (not shown). Channel region 34 is shown to have a width extending between field regions 30.

During formation of field regions 30, P-type dopants 28 diffuse both vertically and laterally through substrate 22. This lateral diffusion extends into channel region 34 and therefore increases the net P-type dopant concentration in channel region 34. Since a transistor's $V_{tb}$ is proportional to the net dopant concentration in its channel region, the lateral diffusion of dopants 28 from field regions 30 to channel region 34 causes an increase in the $V_{tb}$ of select transistor 20. As described earlier, this increased $V_{tb}$ degrades the performance and threatens the stability of select transistor 20.

In one embodiment of the present invention, the implanting of field dopants is controlled so as to space the field regions away from the channel region of the select transistors.

Figure 3A:
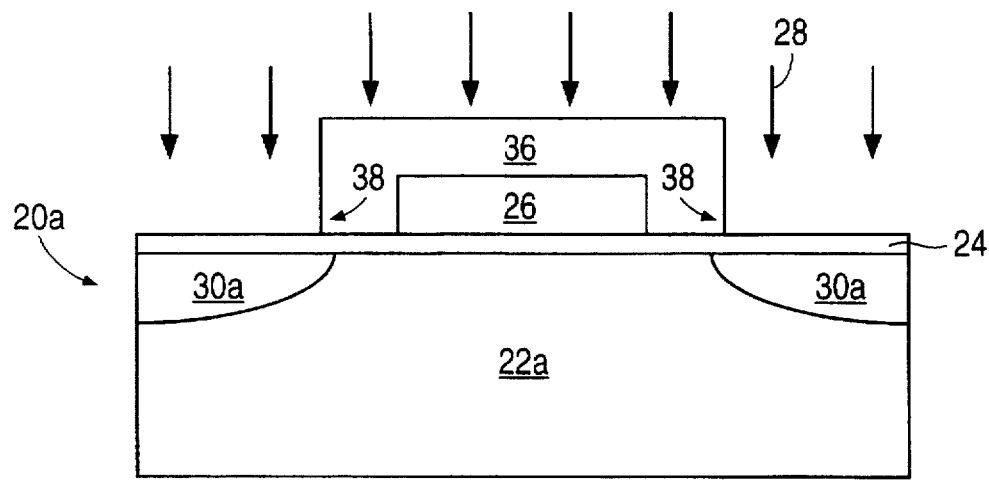
FIG. 3A illustrates a masking step in accordance with an embodiment of the present invention.

Referring to FIG. 3A, select transistor 20a is formed in a P-type substrate 22a. Nitride masking layer 26 is first formed on oxide layer 24. Masking layer 36, which may be a resist or any other suitable masking material, is then provided over nitride masking layer 26. Dopants 28, which are preferably Boron, are then implanted into substrate 22a to form P-type field regions 30. Masking layer 36 shields a portion of substrate 22a from the implantation process so that P-type field regions 30 are not formed in those portions of substrate 22a underlying masking layer 36. Preferably, masking layer 36 extends 0.1 micron beyond an outer edge of nitride layer 26, as indicated by arrows 38.

Figure 3B:
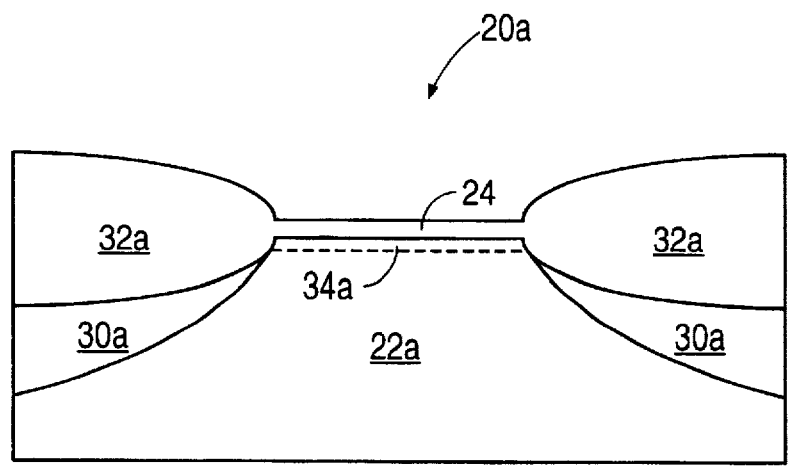
FIG. 3B is a cross-sectional view of a select transistor formed by the masking step illustrated in FIG. 3A.

FIG. 3B shows a portion of to-be-formed select transistor 20a after ion implantation and a LOCOS process used to form field oxide regions 32a have been completed. It can be seen that masking layer 36 results in field regions 30a being spaced away from channel region 34a. Thus, the lateral diffusion of P-type dopants from field regions 30a will not reach channel region 34a and thus will not increase the net dopant concentration in channel region 34 of select transistor 20a. In other words, channel region 34a of to-be-formed transistor 20a (FIG. 3B) will have a lower net dopant concentration than channel region 34 of to-be-formed transistor 20 (FIG. 2B). Accordingly, transistor 20a when formed will have a lower $V_{tb}$ than will select transistor 20.

Thus, modifying the masking layer in this manner minimizes field dopant diffusion into the channel and thereby effectively reduces the net channel dopant concentration. Therefore, this embodiment effectively decreases the value of $V_{tb}$ without requiring an additional processing or masking step. Other than the minimal cost of modifying the field implant mask, no additional manufacturing costs are required.

Figure 1:
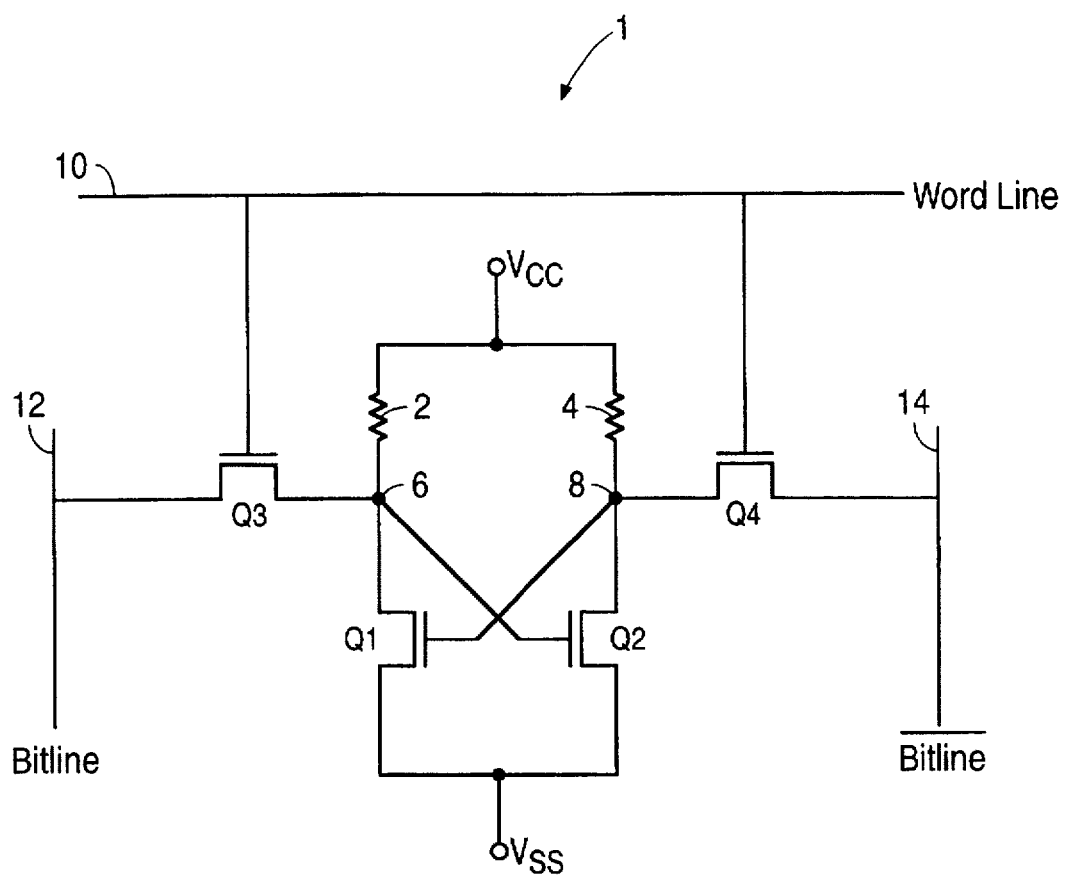
FIG. 1 is a schematic diagram of a prior art four transistor SRAM cell.
Figure 3C:
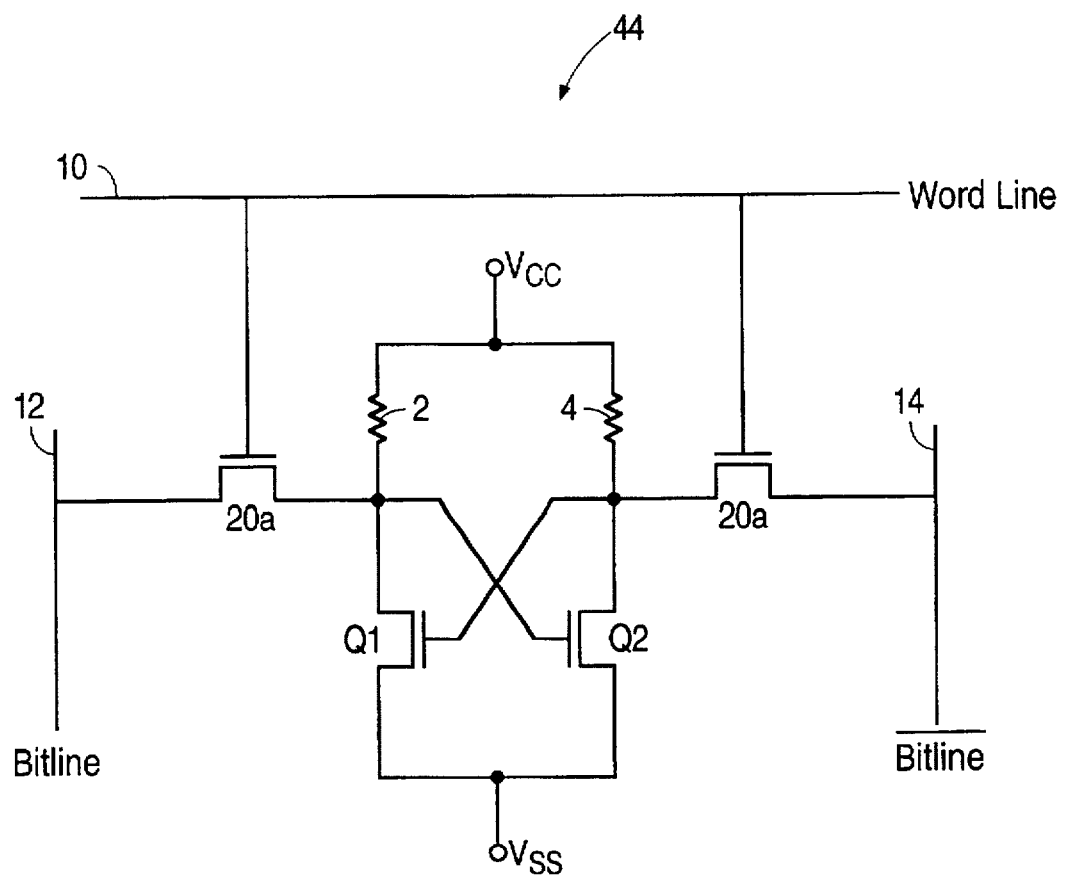
FIG. 3C shows an SRAM cell including the select transistor of FIG. 3B.

FIG. 3C shows improved SRAM cell 44 including improved select transistors 20a. Transistors 20a, formed as described above and shown in FIGS. 3A and 3B, have a lower backgate bias threshold voltage than do prior art select transistors Q3, Q4 of cell 1 (FIG. 1). Referring again to Equation 1, it can be seen that the use of select transistors 20a results in a higher value of $V_H$ which, as discussed earlier, increases the stability of SRAM cell 44. Note that the reading and writing operations of cell 44 are identical to those of cell 1. Those features in common to both cell 1 and cell 44 are labelled with the same numerals.

Figure 4:
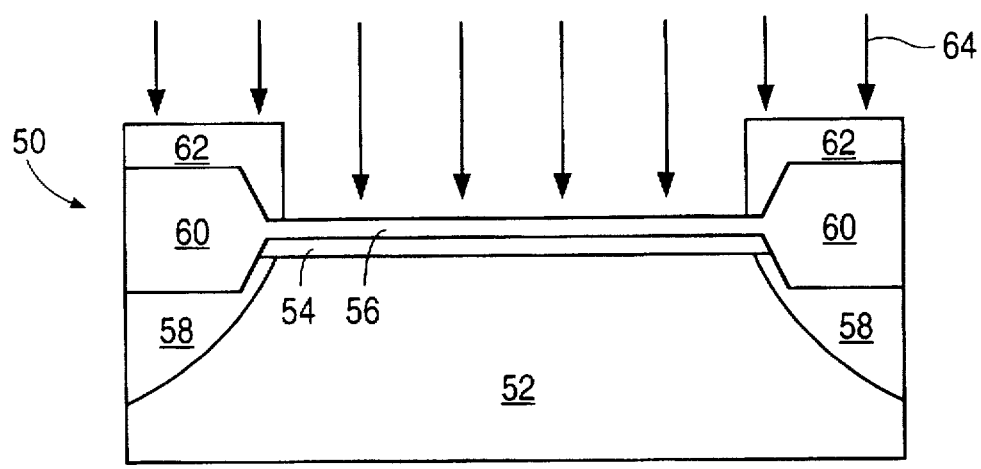
FIG. 4 is a cross-sectional view of yet another embodiment of the present invention.

In another embodiment of the present invention, an additional masking step is used in the fabrication of a memory cell's select transistors to counter-dope the select transistor's channel region. Referring to FIG. 4, to-be-formed select transistor 50 is formed in P-type substrate 52 having a net dopant concentration on the order of $6 \times 10^{16}/cm^3$ and includes channel region 54 and gate oxide layer 56. P-type field regions 58 and field oxide regions 60 help to electrically insulate transistor 50 from adjacent transistors (not shown). Masking layer 62, which may be formed of any suitable masking material, is provided on transistor 50 as shown.

Using masking layer 62 as a shield, N-type dopants 64 (which are preferably either Phosphorus or Arsenic ions) having a concentration of $2 \times 10^{16}/cm^3$ are then implanted into channel region 54 of substrate 52 to counter-dope channel region 54. This counter doping results in channel region 54 having a net P-type dopant concentration of $4 \times 10^{16}/cm^3$. Applicant has found that such a reduction in the net dopant concentration of channel region 54 reduces transistor 50's $V_{tb}$ from 1.5 V to 1.3 V, where transistor 50 includes a gate electrode 0.8 microns in width. Thus, controlling the concentration of dopants 64 implanted into channel region 54 allows for the manipulation of transistor 50's $V_{tb}$ to achieve a more stable memory cell.

Counter-doping channel region 54 as described above may, however, undesirably increase the leakage current of transistor 50. Thus, any reduction in a transistor's $V_{tb}$ must be balanced against any corresponding increase in the transistor's leakage current. Since the amount of leakage current tolerable in select transistors often depends upon the characteristics of its associated memory cell, the amount by which a select transistor's $V_{tb}$ may be reduced is dependent, at least in part, upon its associated memory cell. Further, the width of a transistor's gate electrode may limit the amount by which the transistor's $V_{tb}$ may be lowered. For instance, Applicant has found that reducing the $V_{tb}$ of a transistor having a 0.6 micron wide gate below approximately 1.2 V may "kill" the transistor.

The embodiments of the present invention described above are also applicable for forming more stable memory cells fabricated with CMOS technology. Typically, CMOS memory cells require at least two masking steps. For instance, in a twin-well CMOS device, a first mask layer is used to form the P-type well and a second mask layer is used to form the N-type well. Where two wells of opposite conductivity type are utilized, an additional masking step such as those described above in reference to the embodiments of FIGS. 3A and 4 may be not necessary to achieve a lower $V_{tb}$.

In accordance with another embodiment of the present invention, a first mask used to create an N-type well and a second mask used to create a P-type well may be positioned such the N- and P-wells overlap to create a third well. This third well will have a dopant concentration equal to the net dopant concentration of the N- and P-wells. Accordingly, the N- and P-type dopant implants can be manipulated so that this third well has either a low N- or P-type dopant concentration suitable for creating a select transistor having a reduced $V_{tb}$.

Figure 5A:
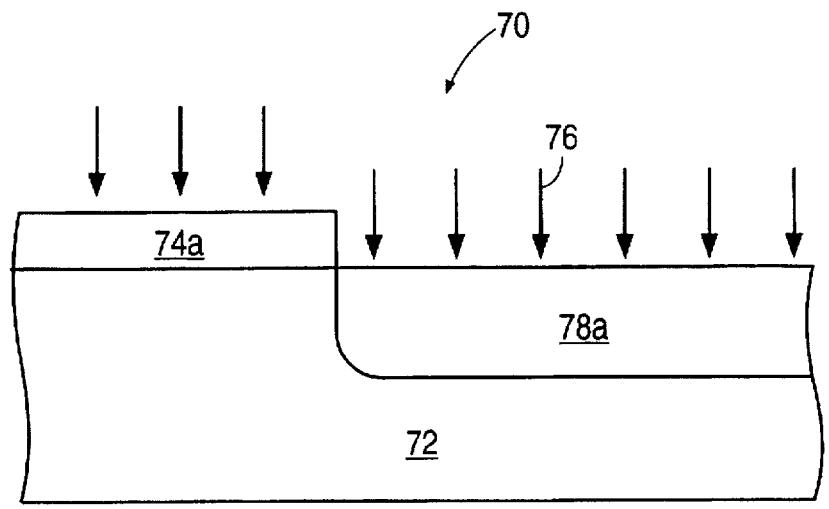
FIGS. 5A and 5B illustrate masking steps used in the fabrication of a select transistor in accordance with another embodiment of the present invention.

FIG. 5A shows the first step in the formation of such a twin-well CMOS device 70 formed in a lightly doped P-type substrate 72. Using masking layer 74a as a shield, N-type dopants 76, which may be either Arsenic or Phosphorus ions, are implanted into substrate 72 so as to form N+ well 78a. Masking layer 74a is then etched away using conventional etching techniques.

Figure 5B:
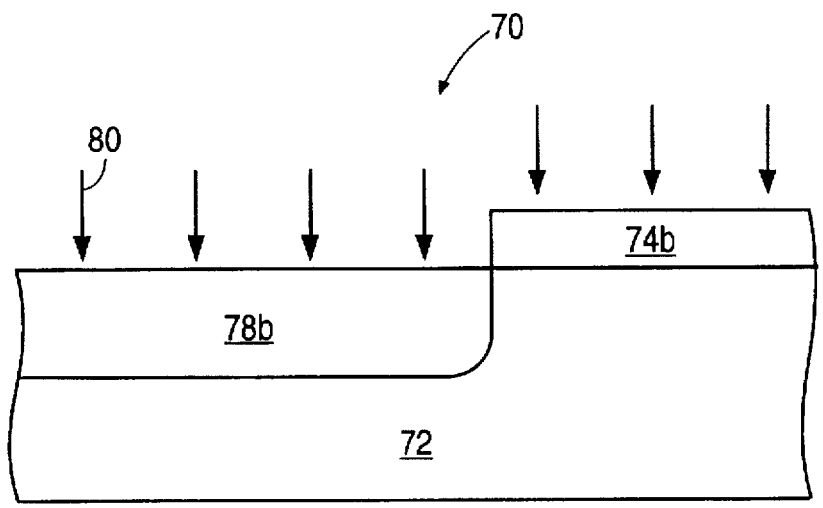

In a similar manner, masking layer 74b is provided on the top surface of substrate 72 such that P-type dopants 80 implanted into substrate 72 form P+ well 78b, as shown in FIG. 5B. For purposes of clarity only, N+ well 78a is not shown in FIG. 5B. Masking layer 74b is then removed. Masking layers 74a and 74b are preferably nitride layers, but may be formed of any suitable masking material.

Figure 5C:
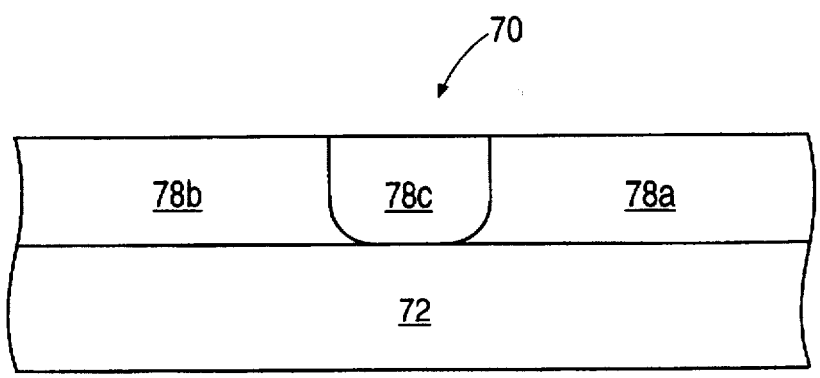
FIG. 5C is a cross-sectional view of the select transistor formed by the masking steps illustrated in FIGS. 5A and 5B.

FIG. 5C shows the resulting structure 70 after the above implantation steps have been completed. As can be seen, masking layers 74a and 74b have been aligned such that resulting N+ well 78a and P+ well 78b overlap to form a third well 78c having a dopant concentration equal to the net dopant concentrations of wells 78a and 78b, respectively. Accordingly, the concentrations of N-type 76 and P-type 80 dopants may be varied so as to control not only the dopant concentration but also the conductivity type of well 78c.

The $V_{tb}$ of a select transistor may also be decreased by reducing the length of the channel region of the transistor (due to the shorter distance charge carriers must travel in order to pass between source and drain). Reducing the channel length of a select transistor, however, also reduces the transistor's on-resistance. As mentioned earlier, $V_L$ is inversely proportional to the select transistor's on-resistance. Since a small $V_L$ (and a large $V_H$) leads to increased stability in an SRAM cell, it is undesirable to reduce a select transistor's on-resistance. In other words, a larger on-resistance (corresponding to a longer channel) must be balanced against a lower $V_{tb}$ (corresponding to a shorter channel).

Accordingly, in yet another embodiment of the present invention an SRAM cell is provided in which the channel region of the select transistor is partially shortened. The gate of the select transistor is etched in such a manner so as to leave one or more notches in the gate. These notches result in one portion of the select transistor's channel region being shorter than other portions of the channel.

Figure 6:
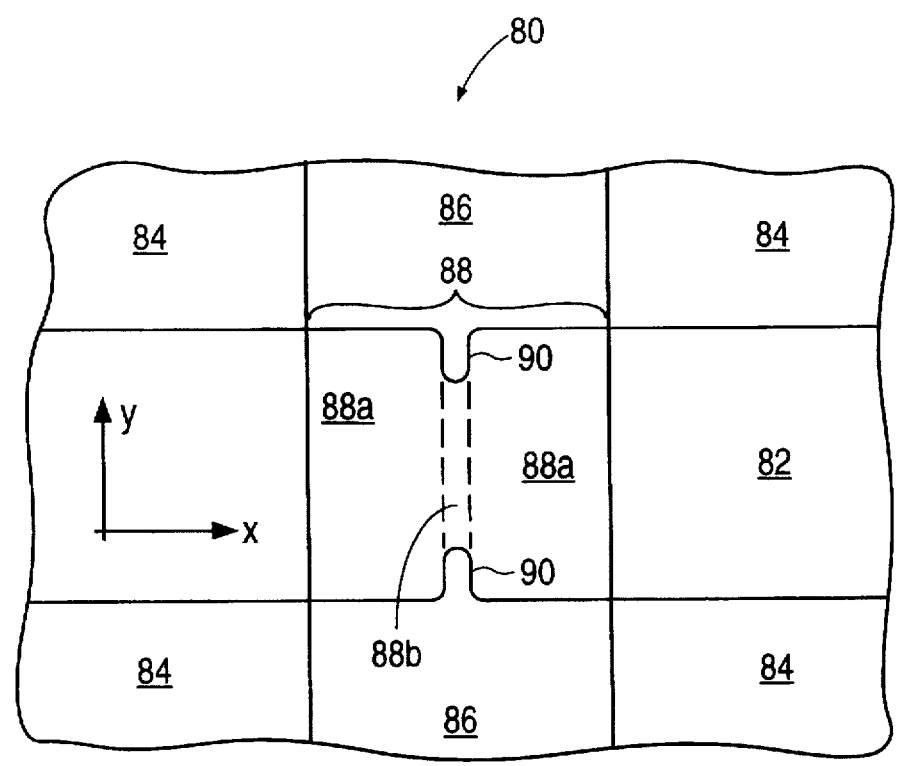
FIG. 6 is a plan view of a MOS transistor having a partially shortened gate in accordance with still another embodiment of the present invention.

Referring to FIG. 6, select transistor 80 is shown having gate 82 overlying field oxide regions 84 and active region 86. Channel region 88 is that portion of active region 86 underlying gate 82. Gate 82 is etched in such a manner as to form notches 90 in gate 82 on either end of channel region 88. Notches 90 formed in gate 82 result in portion 88b of channel region 88 being shorter than portions 88a of channel region 88.

The masking layer (not shown) used in forming notches 90 is tailored so that notches 90 will have squared corners. During the etching process, however, the corners become rounded, as shown in FIG. 6. Applicant knows of no disadvantage attributable to these rounded corners other than increasing the difficulty with which the device parameters of transistor 80 are measured.

Notches 90 should preferably have a width and length approximately equal to ten percent (10%) of the width and length, respectively of gate 82. Referring again to FIG. 6, width is measured along the x-axis and length is measured along the y-axis. Thus, assuming gate 82 of transistor 80 is 0.8 microns wide and 1.0 microns long, notches 90 should be 0.08 microns wide and 0.1 microns long.

Etching gate 82 as described above so that only a small portion of channel 88 is shortened with the remaining portions of channel 88 unaltered results in the operation of transistor 80 being analogous to a short channel transistor in parallel with a long channel transistor. It follows, then, that transistor 80 possesses the advantages of both a short channel transistor and a long channel transistor.

The shortened portion 88b of channel 88, by reducing the distance between source and drain regions, results in a lower $V_{tb}$ for transistor 80. Although the shortened portion 88b of channel 88 slightly reduces the on-resistance of transistor 80, the unaltered portions 88a of channel 88 are sufficient to minimize any resultant decrease in transistor 80's on-resistance. Thus, transistor 80 will have a reduced $V_{tb}$ without any corresponding, significant drop in its on-resistance.

This lower value of $V_{tb}$, as discussed above in reference to Equation 1, has the desirable effect of increasing $V_H$. Similarly, minimizing the reduction in transistor 80's on-resistance, in turn, minimizes any resultant increase in $V_L$. The embodiment described above therefore maximizes the voltage differential between $V_H$ and $V_L$, resulting in a more stable memory cell. Thus, select transistor 80 is advantageous over prior art transistors having a reduced channel length of uniform dimension (i.e., those without notches formed in the gate) whose $V_L$ is significantly increased.

Embodiments of the present invention may be used in the formation of either 4 or 6 transistor memory cells. In addition, the above described embodiments may also be utilized in the formation and operation of multiple port SRAM cells, where the select transistor(s) of each port have a reduced backgate biased threshold voltage.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A method for forming a more stable SRAM cell, said cell including a select transistor formed in a substrate, said select transistor having an associated backgate biased threshold voltage, wherein said method comprises the steps of:

positioning a first masking layer overlying said substrate to define a first well region in said substrate;

implanting dopants of a first conductivity type into said first well region defined by said first masking layer;

positioning a second masking layer overlying said substrate to define a second well region in said substrate; and implanting dopants of a second conductivity type into said second well region defined by said second masking layer, wherein portions of said first and second well regions overlap to define a third well region in said substrate, said third well region having a dopant concentration less than the dopant concentrations of either of said first and second well regions and serving as a channel region for said select transistor so as to effectively reduce said backgate biased threshold voltage of said select transistor and thereby increase the stability of said SRAM cell.

2. A method for forming a more stable SRAM cell, said cell including a select transistor and a storage transistor formed in a substrate, said select transistor having an associated backgate biased threshold voltage, wherein said method comprises the steps of:

patterning a first masking layer disposed on a substrate, wherein a first region of said substrate is exposed;

implanting a dopant of a first conductivity type at a first dose, into said exposed first region, to form a first well region having a first dopant concentration;

patterning a second masking layer disposed on said substrate, wherein a second region of said substrate and a portion of said first well region are exposed, said portion of said first well being adjacent and contiguous to said second region; and implanting a dopant of a second conductivity type at a second dose smaller than said first dose, into said exposed second region and said exposed portion of said first well region, to form a second well region having a second dopant concentration and a third well region of said exposed portion of said first well;

wherein said third well region has a net first dopant type at a third dopant concentration less than said first concentration and wherein said third well serves as a channel region for said select transistor so as to effectively reduce said backgate biased threshold voltage of said select transistor from that of said storage transistor and thereby increase the stability of said SRAM cell.

3. A method of forming an integrated circuit in a semiconductor substrate, comprising the steps of:

forming a first well region of a first dopant type, having a first dopant concentration, in said substrate;

patterning a masking layer disposed on said substrate, wherein a section of said substrate is exposed, said exposed section encompassing a first portion adjacent said first well region and a second portion comprising a section of said first well region contiguous with said first portion; and implanting a second dopant into said exposed section to form a second well region of a second dopant type having a second dopant concentration, either smaller or larger than said first dopant concentration, from said first portion, and a third well region of said second portion, and said third well region having a net dopant type and concentration.

* * * * *